(12) United States Patent
Kim

(10) Patent No.: US 6,501,124 B2
(45) Date of Patent: Dec. 31, 2002

(54) NON-VOLATILE SEMICONDUCTOR MEMORY DEVICE

(75) Inventor: Hung-Jin Kim, Chungcheongbu-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/863,448

(22) Filed: May 24, 2001

(65) Prior Publication Data

US 2002/0018364 A1 Feb. 14, 2002

(30) Foreign Application Priority Data

May 25, 2000 (KR) .......................................... 2000-28366

(51) Int. Cl.[7] ............................................. H01L 29/788
(52) U.S. Cl. ........................ 257/316; 257/317; 257/318; 257/319
(58) Field of Search ................................ 438/257, 266, 438/270, 289; 257/315–319, 365

(56) References Cited

U.S. PATENT DOCUMENTS 5,683,923 A * 11/1997 Shimizu et al.
5,963,480 A * 10/1999 Harari .................... 365/185.29

FOREIGN PATENT DOCUMENTS

JP         02-025076         3/2002

OTHER PUBLICATIONS

Japanese Search Report dated Mar. 25, 2002.

\* cited by examiner

Primary Examiner—David Nelms
Assistant Examiner—Dung A Le
(74) Attorney, Agent, or Firm—Fleshner & Kim, LLP

(57) ABSTRACT

The present invention relates to a non-volatile semiconductor memory device and a fabricating method thereof, which prevents a programming disturbance and enables to have a programming operated by a byte unit by achieving a programming and an erasing of a memory device through a F-N tunneling. The semiconductor memory device can be a non-volatile semiconductor memory device that can include a control gate on a semiconductor substrate in which a device active area and a device isolation are defined, the control gate on the device active area dividing the device active area into a first region and a second region, a first insulating layer covering a top surface and sides of the control gate, a drain region in the first region of the substrate adjacent the control gate, a source region in the second region, a second insulating layer on the second region between the source region and the control gate and on a portion of a surface of the first region between the first insulating layer and the drain region, and a floating gate covering the second insulating layer and the first insulating layer.

17 Claims, 5 Drawing Sheets

NON-VOLATILE SEMICONDUCTOR MEMORY DEVICE

BACKGROUND OF THE INVENTION

1. Field of the Invention

The present invention relates to a non-volatile semiconductor memory device and a fabricating method thereof, more particularly, to a flash/EEPROM in a semiconductor device and a fabricating method thereof.

2. Background of the Related Art

EEPROM is characterized in two categories: a byte erasure type and a flash type. The flash type is further divided into a hot-electron injection type and a F-N(Fowler-Nordhein) current type. An EEPROM/flash type memory device is basically constructed with a MOS transistor having stacked polysilicon gates including a floating gate and a control gate. When there are no electrons in the floating gate, a channel for current to flow through is generated as voltage is applied to the control gate and the voltage applied to the control gate exceeds a threshold voltage to form the channel. When electrons are accumulated in the floating gate, the voltage applied to the control gate forms the channel at a higher level than when there are no electrons in the floating gate because of an electric field offset effect due to the negative charges in the floating gate.

A semiconductor non-volatile memory operates by the principle that electrons accumulated in the floating gate will be unable to escape when an energy barrier exists in both the silicon substrate and the control gate. Electron injection and discharge are performed on a floating gate of a semiconductor non-volatile memory to make the memory electrically rewritable where the threshold voltage of a memory cell increases proportionally with the amount of injected electrons. A non-volatile memory in a semiconductor device is enabled by designating an electron-accumulated state as '1' and a non-electron state as '0' because electrons accumulated around the floating gate do not escape and external electrons do not enter into the floating gate.

A basic structure of a stacked gate, which introduces no selection gate, is similar to a UV-erasing type memory device and is particularly useful for fabricating a highly-integrated memory device. Erasing is achieved by having a control gate, which is either grounded or receiving a negative voltage, and applying a high voltage to a source, resulting in a F-N current between the source and a floating gate thus decreasing the threshold voltage. Alternatively, a negative voltage may be applied to the substrate for a blanket erasing.

Source/drain regions of a non-volatile memory device such as an EEPROM are impurity diffusion regions doped heavily with impurities, while a channel region is formed in an active area of a substrate over which the floating and control gates overlap each other.

Cell programming is achieved by injecting hot channel electrons, which are generated from a drain stage of the channel region by applying a predetermined voltage to the control gate and the drain region, respectively, into a floating gate. Programming is achieved by hot channel electron injection so that the hot carriers generated near the drain are injected into the floating gate from the drain, provided that the channel region is inversed by applying a high voltage to the control gate and applying a proper voltage to the drain, where the source and well are grounded. Erasing is achieved by discharging carriers stored in the floating gate. Erasing of an EEPROM is completed by U-V erasure or by applying a high voltage to the source or drain regions or the bulk. Reading is achieved by judging a cell status of on/off by means of reading the threshold voltage of a cell transistor. For instance, once the control gate and the drain are supplied with 5V and 1V respectively, the threshold voltage of the programmed cell becomes high (at least over 5V) to be 'off', while the erased cell becomes low to be 'on'. In other words, EEPROM (electrically erasable and programmable read only memory) enables data to be programmed and erased electrically, which means that EEPROM installed in a system enables the system to rewrite data with ease.

Flash EEPROM developed from EEPROM enables programming of data by a byte or more according to the design and to erase data by bits or a block, thereby improving the operating speed of EEPROM greatly. Accordingly, a non-volatile flash memory device, of which integration is superior to that of EEPROM, meets the needs of a high capacity memory device and enables high speed data reading operation for portable office automation. However, a flash memory device of 1 Tr type (ETOX) fabricated by the related art consumes electric current excessively, thereby requiring an oversized voltage pump circuit. And, the flash memory device according to the related art requires an additional circuit for preventing electrical disturbance if a selection gate is not introduced. Moreover, the more frequently the device is used, the less reliable the flash memory device according to the related art becomes because of the limited endurance of programming and erasing.

FIG. 1A and FIG. 1B show cross-sectional views seen from the directions of channel length and width, respectively, of an EEPROM device in a semiconductor device fabricated by a related art. In FIGS. 1A–1B, a field oxide layer 11 defining a device isolation area and a device active area are formed by LOCOS (local oxidation of silicon) on predetermined portions of a silicon substrate 10, thereby exposing the device active area. In the active area of the substrate 10, a gate insulating layer 12 formed of oxide, a floating gate 13 formed of polysilicon on the gate insulating layer 12, an inter-poly layer 14 formed of an insulator of an O-N-O structure, and a control gate 15 of polysilicon are formed.

A method of fabricating a non-volatile memory device according to the related art includes forming a second conductive type well in a predetermined portion of a first conductive type silicon substrate 10, then forming by LOCOS a field oxide layer 11, which acts as a device isolation layer. Next, a gate oxide layer 12 is formed by oxidizing a surface of the substrate 10 thermally and a polysilicon layer is deposited on the gate oxide layer 12, followed by the formations of a floating gate 13 by patterning the polysilicon layer and the gate insulating layer so that the polysilicon layer and the gate insulating layer remain within a memory cell only. An O-N-O layer 14 is then formed on an exposed top surface of the floating gate 13.

After an upper polysilicon layer has been deposited on the substrate including the surface of the O-N-O layer 14, where the O-N-O layer 14 acts as an insulating layer between the polysilicon layers, a control gate 15 is formed in a direction along the length of the channel by patterning the upper polysilicon layer to extend to another memory cell. Then, an impurity diffusion region 16 is formed by implanting first conductive type impurity ions, where the control gate 15 is used as a mask, then diffusing the impurity ions to form source and drain regions 16. In this case, the impurity diffusion regions 16 may be formed with either a symmetrical junction or an asymmetrical junction, where the symmetrical junction is used for a negative erase while the asymmetrical junction used for a positive erase.

As mentioned in the above description of the non-volatile memory device (of a single poly gate type EEPROM) fabricated by the related art, the area occupied by a cell with a single gate is relatively large and the voltage applied for programming and erasing operations carried out by F-N tunneling is relatively high. Moreover, in a split gate type EEPROM constructed with 2 or 3 gates according to the related art, programming and erasing are achieved by the injection of hot electrons and by F-N tunneling, respectively. Namely, the split gate type introduces a structure where the control gate covers the floating gate.

As described above, the related art EEPROM have various disadvantages. The split-gate type EEPROM according to the related art produces disturbances and consumes lots of power when a programming is carried out by hot electron injection. Additionally, in a non-volatile memory cell according to the related art, it is difficult to increase a coupling ratio, which is defined as the areas of the control gate and the floating gate in contact with the inter-poly layer 14 where the coupling ratio depends on a planar structure that does not include the part over the field oxide layer 11.

SUMMARY OF THE INVENTION

An object of the present invention is directed to a non-volatile semiconductor memory device and a fabricating method thereof that substantially obviate one or more of the problems due to limitations and disadvantages of the related art.

Another object of the present invention is to provide a flash/EEPROM in a semiconductor device and a fabricating method thereof that prevents programming disturbance and enables programming operated by a byte unit by achieving a programming and an erasing of a memory device through a F-N tunneling using a coupling ratio between floating and control gates.

Another object of the present invention is to provide a flash/EEPROM in a semiconductor device and a fabricating method thereof that has a floating gate over a control gate having a source region less overlapped than a drain region.

Another object of the present invention is to provide a flash/EEPROM in a semiconductor device and a fabricating method thereof that reduces a cell area by removing a control transistor.

Another object of the present invention is to provide a flash/EEPROM in a semiconductor device and a fabricating method thereof that prevents programming disturbance and enables programming operated by a byte unit by achieving a programming and an erasing of a memory device through a F-N tunneling using a coupling ratio between floating and control gates by means of forming a structure where the control gate is covered with the floating gate, a drain region is properly overlapped by coupling, and a source region is less overlapped.

Another object of the present invention is to provide a memory device compatible with a flash EEPROM by realizing various functions such as MCU on one chip.

Another object of the present invention is to realize an ultra-highly integrated device by reducing a cell area itself and a total memory area by means of removing a control transistor for erasing by byte unit in an EEPROM.

To achieve at least these and other advantages in a whole or in part and in accordance with the purpose of the present invention, as embodied and broadly described, the present invention includes a control gate on a semiconductor substrate in which a device active area and a device isolation are defined, the control gate lying on the device active area, the control gate dividing the device active area into a first region and a second region wherein a control gate insulating layer is inserted between the substrate and the control gate, a first insulating layer covering a top surface and a side of the control gate, a drain junction in the first region of the substrate, a source junction in the second region, the source junction separated from the control gate to a predetermined distance, a second insulating layer on the second region between the source junction and the control gate and on a predetermined portion of a surface of the first region between the first insulating layer and the drain junction, and a floating gate covering the second insulating layer and the first insulating layer.

To further achieve the above objects in a whole or in part, a non-volatile semiconductor memory device according to the present invention can further include a third insulating layer at a later surface of the first insulating layer, an insulating interlayer covering the device active area including a surface of the floating gate, a contact hole in a predetermined portion of the insulating interlayer, the contact hole exposing a portion of the drain junction in the first region where the floating gate is not located, and a bit line on the insulating interlayer, the bit line contacted with the drain junction through the contact hole.

To further achieve the above objects in a whole or in part, a semiconductor device according to the present invention includes a plurality of device active areas separated from one another in parallel by a plurality of device isolation layers in a first direction on a semiconductor substrate where a plurality of memory cell areas are defined, a plurality of control gates crossing over the device active areas and the device isolation layers, where the respective control gates are separated from one another in a second direction perpendicular to the first direction, a plurality of drain junctions in the device active areas at one side of the respective control gates, respectively, a plurality of source junctions in the device active areas at the other side of the respective control gates, respectively, the respective source junctions are separated from the control gates by a predetermined distance, respectively, and a plurality of floating gates overlap with the control gates, portions of the drain junctions, and portions of the device active areas where the source junctions are not formed at the other sides of the control gates, respectively.

To further achieve the above objects in a whole or in part, the lay out of the semiconductor device according to the present invention can further include a plurality of bit line contacts at predetermined portions of the drain junctions which are not overlapped with the floating gates in the memory cell areas, respectively, and a plurality of bit lines contacted with the respective bit line contacts, the bit lines overlapped with the respective device active areas, the bit lines extending to the first direction.

To further achieve the above objects in a whole or in part, a method of forming a semiconductor device according to the present invention includes forming a control gate on a predetermined portion of a memory cell area of a semiconductor substrate wherein the memory cell area which is divided into a first region and a second region by the control gate is defined by a device isolation layer and wherein a control gate insulating layer is inserted between the control gate and the semiconductor substrate, forming a first insulating layer on an exposed surface of the control gate, forming a drain junction in the first region, forming a third insulating layer covering predetermined portions of the second region and the drain junction wherein the third insulating layer is extended from the first insulating layer, forming a floating gate on the third insulating layer and an exposed surface of the first insulating layer, and forming a source junction in the second region which is not overlapped with the floating gate.

To further achieve the above objects in a whole or in part, after the step of forming the first insulating layer, the method can further include forming a second insulating layer on a surface of the first insulating layer at a side of the control gate wherein the second insulating layer differs from the first insulating layer greatly in etch selectivity.

To further achieve the above objects in a whole or in part, the forming a third insulating layer and a floating gate can include forming an oxide layer on the exposed surface of the first region and a tunneling oxide layer on the second region of the substrate, forming a conductive layer over the substrate including the oxide layer, the tunneling oxide layer, and the first insulating layer, and patterning the conductive layer, the oxide layer and the tunneling oxide layer to be overlapped with the control gate and portions of the drain and source junctions.

To further achieve the above objects in a whole or in part, a method of forming a semiconductor device according to the present invention includes the steps of forming a control gate on a predetermined portion of a memory cell area of a semiconductor substrate wherein the memory cell area which is divided into a first region and a second region by the control gate is defined by a device isolation layer and wherein a control gate insulating layer is inserted between the control gate and the semiconductor substrate, forming a first insulating layer on an exposed surface of the control gate, forming a second insulating layer on a surface of the first insulating layer at a side of the control gate wherein the second insulating layer differs from the first insulating layer greatly in etch selectivity, forming a drain junction in the first region, forming an oxide layer on the exposed surface of the first region and a tunneling oxide layer on the second region of the substrate, forming a conductive layer over the substrate including the oxide layer, the tunneling oxide layer, and the first insulating layer, forming a floating gate and a third insulating layer by patterning the conductive layer, the oxide layer and the tunneling oxide layer to be overlapped with the control gate and portions of the drain and source junctions, and forming a source junction in the second region which is not overlapped with the floating gate.

To further achieve the above objects in a whole or in part, after the forming the source junction in the second region, the method can further include forming an insulating layer over the semiconductor substrate including the floating gate, forming a contact hole exposing a portion of the drain junction which is not covered with the floating gate by removing a portion of the insulating layer, and forming a bit line on the insulating interlayer wherein the bit line fills up the contact hole.

To further achieve the above objects in a whole or in part, in a non-volatile semiconductor memory device including a plurality of memory cells each of which consists of a control gate, a drain junction, a source junction, a floating gate, a word line, and a bit line, wherein an electric charge Q1 of a first parasitic capacitor generated from a voltage Vcg applied to the control gate and a voltage Vfg induced on the floating gate is C1 (Vcg−Vfg) and C1 is a capacitance of the first parasitic capacitor, wherein an electric charge Q3 of a third parasitic capacitor generated from a voltage Vs at the source junction and a voltage Vfg induced on the floating gate is C3(Vs−Vfg) and C3 is a capacitance of the third parasitic capacitor, wherein an electric charge Q4 of a fourth parasitic capacitor generated from a voltage Vb at a bulk and a voltage Vfg induced on the floating gate is C4(Vb−Vfg) and C4 is a capacitance of the fourth parasitic capacitor, and wherein an electric charge Q2 of a second parasitic capacitor generated from a voltage Vd at the drain junction and a voltage Vfg induced on the floating gate is C2(Vd−Vfg) and C2 is a capacitance of the second parasitic capacitor, to further achieve the above objects in a whole or in part, a method of preventing disturbance of a non-volatile semiconductor memory according to the present invention includes such that (1) a programming is achieved by selecting one of two variables Vcg and Vd which prevents the disturbance at the word line and the bit line according to the formula Vfg=(C1Vcg+C2Vd)/Ctotal and wherein the programming is achieved by F-N tunneling using voltage difference between the floating gate and the source junction and a channel region at a side of the source junction, thereby injecting electrons into the floating gate, and (2) an erasing is achieved by discharging electrons accumulated in the floating gate in use of F-N tunneling, which uses voltage difference between the floating gate and a lateral side of the source junction, and wherein the erasing is achieved by selecting the voltages Vcg and Vs not to discharge the electrons into the source junction due to a voltage applied to another memory cells sharing the word line. Preferably, Vfg is equal to [C1Vcg+C2Vd+C3Vs+C4Vb]/Ctotal as total of the electric charges (Q1+Q2+Q3+Q4) of the first to fourth parasitic capacitors is approximately equal to 0 when the floating gate at neutral and Ctotal is approximately equal to C1+C2+C3+C4.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Preferred embodiments of the present invention relate to a flash/EEPROM in a semiconductor device and a fabricating method thereof that reduce or prevent programming disturbances and enable programming and erasing of a memory device through F-N tunneling using a coupling ratio between floating and control gates, which enables programming operated by a byte unit to be applied to an EEPROM or a flash EEPROM, where the coupling ratio between a floating gate capacitor and a control gate capacitor determines a control gate voltage applied to a floating gate as well as the programming time.

In one case, the coupling ratio that determines a voltage level in the floating gate has an influence on a threshold voltage VTpgm level of the programming. Compared to a single poly gate type structure of the related art, the present invention can preferably add a control gate to improve the coupling ratio and reduce an area occupied by a memory cell by means of negative erasure. Further, compared to a split gate type non-volatile memory device of the related art, the present invention can use a structure where a floating gate lies over a control gate. Thus, according to the present invention, programming can be executed by F-N tunneling and any disturbances are prevented without needing an additional inhibition-preventing mode.

Figure 1A:
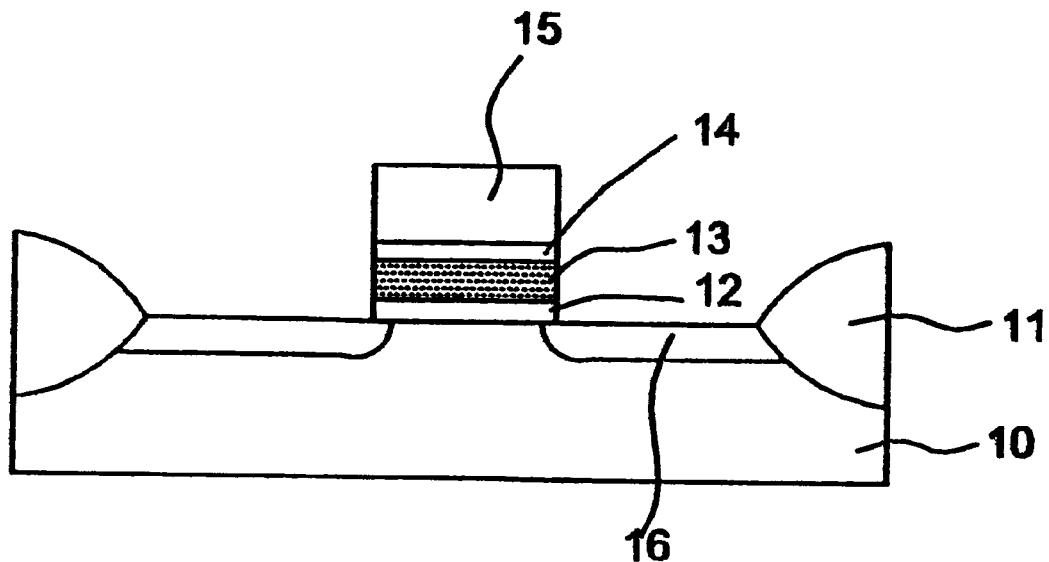
FIG. 1A and FIG. 1B show cross-sectional views seen from the directions of channel length and width respectively, of a flash EEPROM device in a semiconductor device fabricated by a related art.
Figure 1B:
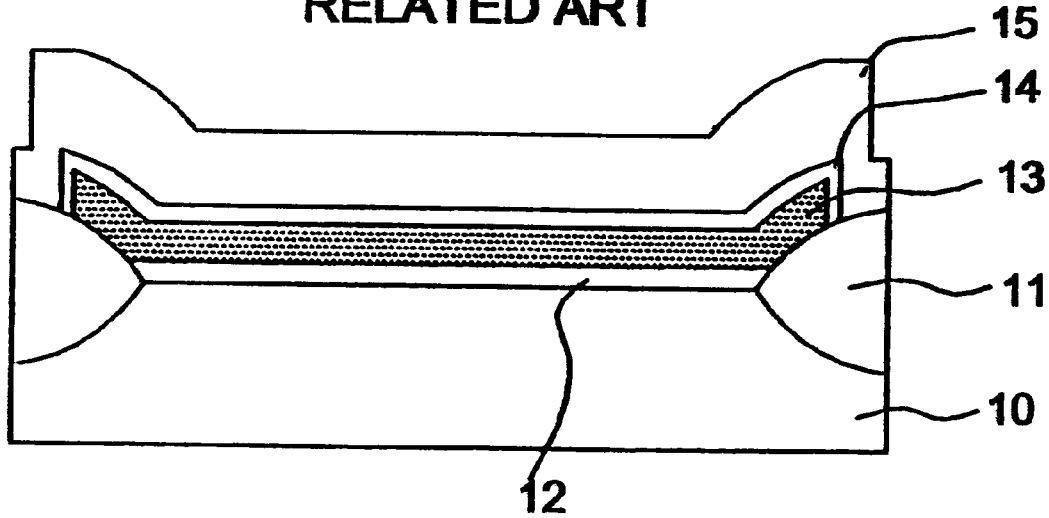
Figure 2A:
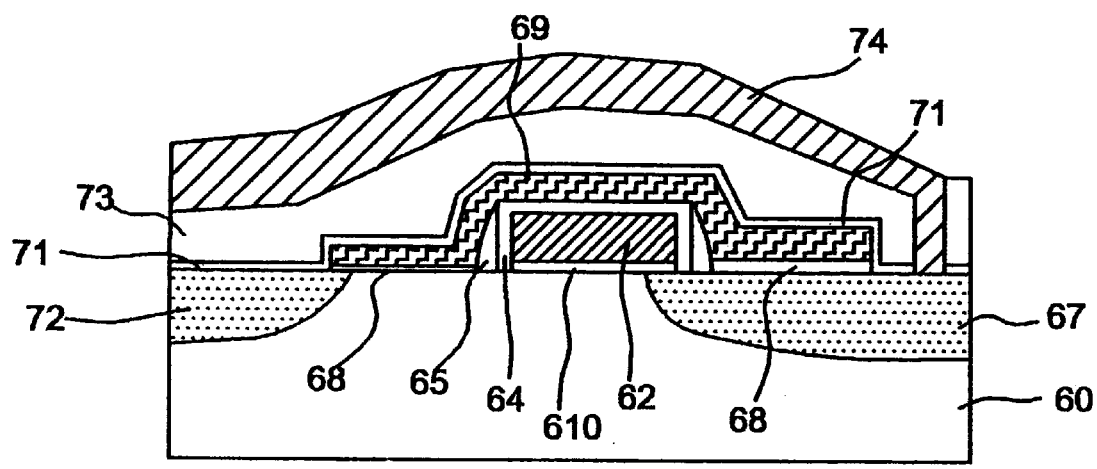
FIG. 2A and FIG. 2B are diagrams that show a cross-sectional view seen from the direction of channel length and a layout of an EEPROM device in semiconductor devices fabricated by preferred embodiments of the present invention.

FIG. 2A is a diagram that shows a cross-sectional view seen from a first direction, which is the direction of channel length of a non-volatile semiconductor memory device fabricated by the present invention, where a gate insulating layer 610 of silicon oxide or the like and a control gate 62 are formed in order on a top surface of a device active area of a silicon substrate 60 of a first conductive type in which device active and isolation areas are defined, respectively. In a preferred embodiment, the control gate 62 is elongated in a second direction, which is a channel width direction of the device, and is preferably coupled to other control gates of neighboring memory cells (not shown). The control gate 62 is formed of polysilicon doped with first or second conductive type impurity ions for electric conduction.

An oxide layer 64 for an inter-polysilicon layer 64 is preferably formed to a predetermined thickness to electrically isolate the control gate 62 from a floating gate 69 on a top surface and a side of the control gate 62 where the gate insulation layer 610 has not been formed. A sidewall spacer 65 of a nitride layer or the like is preferably formed at a lateral side of the inter-polysilicon layer 64 of oxide. Next, a drain 67 of a second conductive type impurity ion diffusion region or the like is formed in a drain forming region of the substrate 60, which lies at and extends from one end of the control gate 62. As shown in FIG. 2A, centering around the control gate 62, a source 72 of a second conductive type impurity ion diffusion region is formed in a source forming region of the substrate separated from the control gate 62 by a predetermined distance and confronts the drain forming region in the device active area of the substrate 60.

A floating gate 69 is preferably formed on surfaces of the sidewall spacer 65 of nitride and the inter-polysilicon layer 64. One end of the floating gate 69 extends over a portion of the drain 67, while the other end of the floating gate 69 extends to an edge of the source 72. In this case, a tunneling oxide layer 68 is inserted between the floating gate 69 and the device active area. Separated from other floating gates in the neighboring memory cells, the floating gate 69 is designed to remain inside a single memory cell and is formed of a polysilicon doped with a first or second conductive type impurity for electric conduction.

An oxide layer 71 is formed on a surface of the floating gate 69 and the remaining surfaces of the active area preferably by oxidation to cover the exposed surfaces of the drain 67 and the source 72, as well as, the exposed surface of the floating gate 69. A transistor for a non-volatile memory device is preferably constructed with the control gate 62 surrounded by the insulating layers 610, 64, and 65, the tunneling oxide layer 68, the floating gate 69, and the source 72 and the drain 67. An insulating interlayer 73 is then formed of oxide or the like over the substrate, including the transistor, to be used as a non-volatile memory device. A bit line 74 is finally formed on a surface of the insulating interlayer 73 and electrically coupled to a portion of the drain 67, thereby completing a semiconductor non-volatile memory device.

Figure 2B:
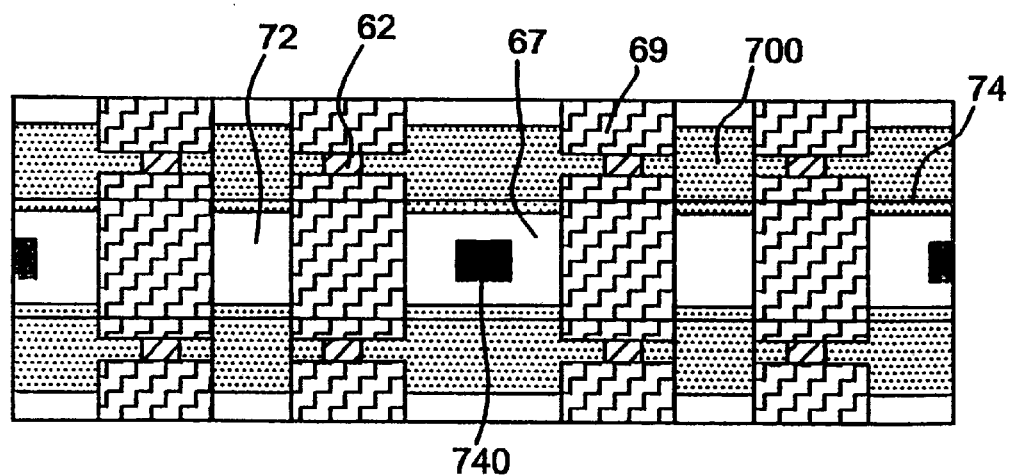

FIG. 2B shows a layout of an EEPROM device, which is similar to FIG. 2A, in a semiconductor device where a device isolation area 700 and device active areas are defined on a silicon substrate of a first conductive type semiconductor substrate by a field oxide layer 700 elongated to a first direction, which is horizontal in FIG. 2B. A control gate 62, beneath which a control gate insulating layer of oxide lies, is formed on a surface of the active area of the silicon substrate. A bit line 74, which penetrates into a portion of an insulating interlayer 73 and is then electrically coupled through a bit line contact 740 to a portion of a drain 67 that is not overlapped with a floating gate 69 or an oxide layer 71, is formed on a surface of the insulating interlayer 73 (not shown), thereby completing a semiconductor non-volatile memory device.

The device active areas are defined by a plurality of the field oxide layers 700, running in a first direction and a plurality of the control gates 62 are elongated in a second direction, or the channel width direction, crossing the device active areas and the plurality of field oxide layers 700.

Each memory cell shares the source 72 and the drain 67 of the adjacent left and right memory cells in the first direction, respectively. The floating gate 69 covers over the control gate 62, preferably has a rectangular shape and is formed in a domain of the single memory cell area. As illustrated in FIG. 2B, for example, the drain 67 partially overlaps the floating gate 69, while the source 72 is less overlapped with the floating gate 69.

Figure 3:
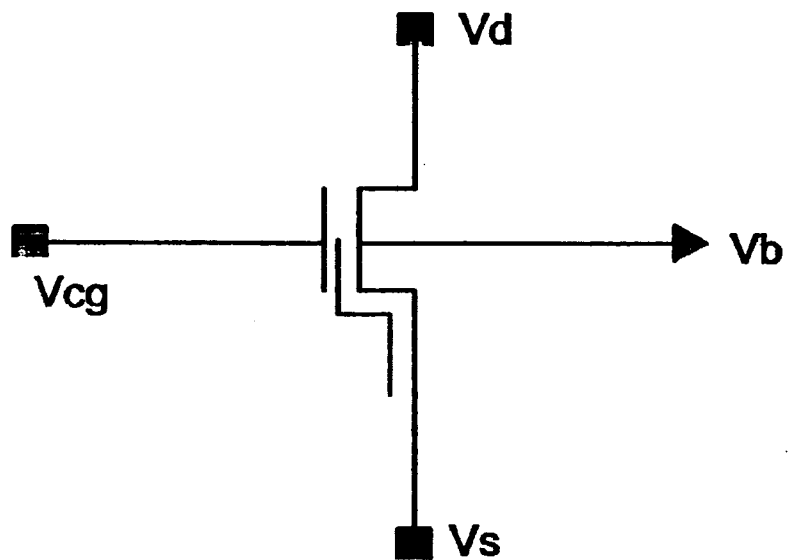
FIG. 3 is a diagram that shows a circuit of a non-volatile memory device according to a preferred embodiment of the present invention.

FIG. 3 is a diagram that shows a schematic circuit of a single cell according to a preferred embodiment of the present invention of a non-volatile memory device or the like where the voltages applied to a control gate, a drain, a source, and a substrate bulk are designated by Vcg, Vd, Vs, and Vb. A floating gate can be coupled between the control gate and the substrate bulk, to allow data to be stored electrically by storing or discharging electrons. Programming or erasing can be controlled by applying a predetermined voltage to the control gate where the control gate functions as a gate of a transistor on reading. On programming or erasing, electrons can be injected into or discharged from the floating gate from a lateral side of the source and the channel regions, while a tunneling oxide layer, through which F-N current flows, is inserted between the source and the floating gate.

Figure 4:
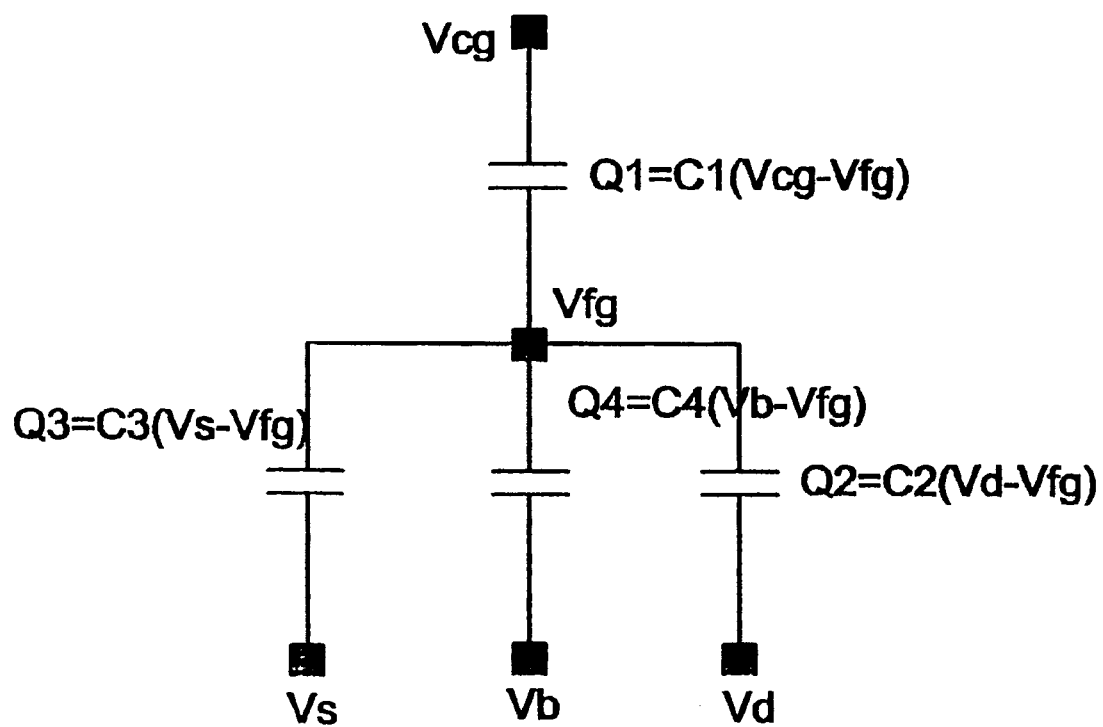
FIG. 4 is a diagram that shows a circuit for capacitors in a non-volatile memory device according to a preferred embodiment of the present invention.

FIG. 4 is a diagram that shows a circuit for capacitors in a non-volatile memory device to preferably illustrate parasitic capacitances in a preferred embodiment where an electric charge Q1 of a parasitic capacitor, which is generated between a control gate with an applied voltage of Vcg and a floating gate with an induced voltage of Vfg becomes C1(Vcg−Vfg), where C1 is a capacitance of the parasitic capacitor. Another electric charge Q3 of a parasitic capacitor generated between a floating gate with a voltage of Vfg and a source with a voltage of Vs becomes C3(Vs−Vfg), where C3 is a capacitance of the corresponding parasitic capacitor.

Another electric charge Q4 of a parasitic capacitor generated between a floating gate with a voltage of Vfg and a bulk substrate with a voltage of Vb becomes C4(Vb−Vfg), where C4 is a capacitance of the corresponding parasitic capacitor. A further electric charge Q2 of a parasitic capacitor generated between a floating gate with a voltage of Vfg and a drain with a voltage of Vd becomes C2(Vd−Vfg), where C2 is a capacitance of the corresponding parasitic capacitor. From such relations, when the floating gate is neutral, the total electric charges (Q1+Q2+Q3+Q4) is 0. In other words, Vfg=[C1Vcg+C2Vd+C3Vs+C4Vb]/Ctotal, wherein Ctotal is C1+C2+C3+C4. When the voltages applied to the source and bulk are 0 (that is, Vs=Vb=0), the voltage of the floating gate is denoted by Vfg=(C1Vcg+C2Vd)/Ctotal or Vfg=(C1Vcg+C3Vs)/Ctotal.

A coupling ratio of an EEPROM, as explained in the previous description, is numerally expressed by the degree of a voltage induced on the floating gate when a bias voltage is applied to a single cell. Therefore, preferred embodiments according to the present invention reduce or prevent neighboring cells from malfunctions such as data loss, disturbance on programming or erasing by using the coupling ratio.

Operations of an EEPROM, according to preferred embodiments of FIGS. 3 and 4 will now be described, where initially for programming an EEPROM, [Vcg=Vpp1, Vd=Vpp2, Vb=0, Vs=Vfg], [Vcg=Vpp1, Vd=0, Vb=0, Vs=Vfg], and [Vcg=0, Vd=Vpp2, Vb=0, Vs=Vfg] are programmed into a selected cell, a word line sharing cell, and a bit line sharing cell, respectively. Programming uses the phenomenon that occurs when electrons are injected into the floating gate by F-N tunneling effect, which uses a voltage difference between the floating gate and the source and channel region at the side of the source. In this case, Vfg is determined by the formula of Vfg=(C1Vcg+C2Vd)/Ctotal, which depends on a couple of variables Vcg and Vd, wherein the disturbance generated from the word line sharing cell is a factor of Vfg=C1Vcg/Ctotal, which is lower than another Vfg of a cell to be programmed. Therefore, a value of Vcg for preventing the disturbance may be selected, and other disturbances by the bit line may be prevented by similar methods.

A preferred embodiment according to the present invention can prevent such disturbances and thus meets the requirement for a byte erasable EEPROM sufficiently. As electrons are injected into a floating gate of a programming cell, the threshold voltage of a transistor is increased by the floating gate on the source region of the cell. Namely, on reading, Vfg<VT is satisfied by Vcg and Vd. Initially for erasing an EEPROM, [Vcg=(−Vpp1), Vs=Vpp3, Vd=0, Vb=0], [Vcg=(−Vpp), Vd=0, Vb=0, Vs=0], and [Vcg=0, Vd=0, Vb=0, Vs=Vpp] are programmed into a selected cell, a word line sharing cell, and a source sharing cell, respectively.

Erasing is achieved by the negative erasing method, wherein electrons accumulated in the floating gate are discharged by F-N tunneling, which uses the voltage difference between the floating gate and the junction region at the side of the source. In this case, as the word line sharing cells receive stresses amounting to −Vpp, which is a prescribed voltage of −Vpp that prevents electrons from being discharged into the source region by the voltage of −Vpp, and thus prevents a disturbance from being generated if Vpp3 is applied to the source line. Thus, the threshold voltage of the transistor including the floating gate near the side of source is decreased under negative value by the discharged electrons, thereby becoming a sufficient inversion state.

Figure 5A:
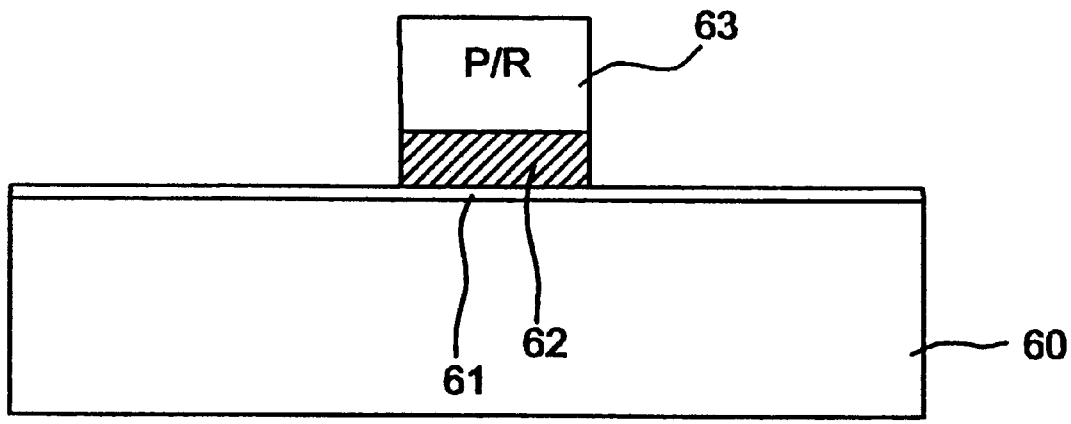
FIG. 5A to FIG. 5D are diagrams that show cross-sectional views from a channel length direction of fabricating a semiconductor memory device according to a preferred embodiment of the present invention.

FIGS. 5A to 5D illustrate a preferred method of the present invention, which can, for example, be used to form the preferred embodiment shown in FIG. 2. As shown in FIG. 5A, a device isolation layer is formed on a silicon substrate 60 of a first conductive type to define a device isolation area and a device active area by STI (shallow trench isolation), LOCOS (local oxidation of silicon) or the like. Next, the threshold voltage of a device is adjusted by ion implantation on an exposed surface of the substrate 60. An oxide layer 61 for a gate insulating layer is formed by thermal oxidation or the like on a surface of the active area of the exposed silicon substrate 60. Then, a conductive layer for a control gate is formed on the oxide layer 61 by chemical vapor deposition or the like. In this case, the conductive layer is formed by depositing in-situ doped polysilicon or by depositing undoped polysilicon and then doping the undoped polysilicon with impurities for electric conduction.

Compared to the steps of forming a floating gate and forming a control gate beneath which an inter polysilicon layer is formed according to the related art, a preferred method of the present invention forms an etch mask 63 on the conductive layer for a control gate. In this case, the etch mask 63 forms a control gate by coating the conductive layer for a control gate with photoresist and then by defining a photoresist pattern 63 by exposure and development of the photoresist, where the etch mask preferably extends to other portions of the conductive layer in the neighboring cells. Then, a control gate 62 is formed of doped polysilicon by removing a portion of the conductive layer not covered with the etch mask 63 by anisotropic etching such as dry etching and the like, thereby exposing a portion of the oxide layer 61 for forming a gate insulating layer.

Figure 5B:
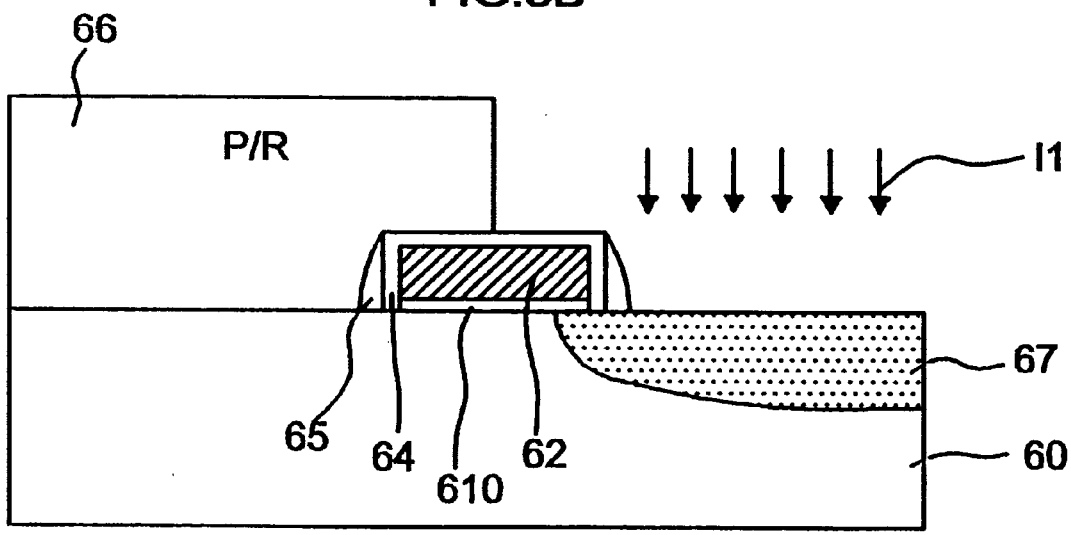

In this case, one of the control gate 62 extends to other control gates of neighboring cells over the device active and isolation areas in a predetermined direction, and one side of the device active area is a source forming region while the other side is a drain forming region centering around the control gate 62. As shown in FIG. 5B, a control gate insulating layer 610 including a remaining oxide layer 610 is formed by removing a portion of the oxide layer that is not covered with the etch mask using the anisotropic etch such as dry etch or the like. Thus, the control gate insulating layer 610 is formed between the control gate 62 and the substrate 60, and the etch mask formed of the remaining photoresist is removed by O$_2$ action or the like, thereby exposing a surface of the control gate 62. Next, an insulating layer 64 is formed on the exposed surface of the control gate 62. In this case, the insulating layer 64 is formed preferably by oxidizing the exposed surface of the control gate 62 of polysilicon preferably by thermal oxidation or the like. Then, a nitride layer is formed over the substrate, including the insulating layer of oxide, and a sidewall spacer 65 is formed by leaving a portion of the nitride layer 65 at the lateral sides of the insulating layer 64 by using a surface of the oxide layer on the top surface of the control gate 62 as an etch-stop layer.

Thus, the control gate insulating layer 610 separates the control gate 62 from the substrate 60, the insulating layer 64 of oxide covers the remaining surface of the control gate 62 for isolation, and the nitride of the sidewall spacer 65 insulates the sidewall spacer 65 on at least one of the lateral sides of the control gate 62 and protects at least one of the lateral side surfaces of the control gate 62, thereby preferably protecting the insulating layer 64 and the control gate insulating layer 610 from damage by the cleaning process before forming a tunneling oxide layer.

Next, the substrate, including the control gate protected by the insulating layer 64, is coated with photoresist and the photoresist is patterned by exposure and development. The photoresist pattern 66 preferably exposes the drain forming region of the device active area but may also be patterned to expose other regions. In this case, the drain and source forming regions of the device active area preferably oppose each other and are centered around the control gate 62, thereby improving a process margin for forming the photoresist pattern 66 for exposing the drain forming region. Then, a second conductive type impurity ion buried layer is formed by implanting second conductive type impurity ions I1 heavily into the drain forming region of the exposed substrate, and a drain 67 is formed by diffusion of the second conductive type impurity ion buried layer preferably by heat treatment such as annealing or the like. In this case, the photoresist pattern 66 may be removed before the diffusion or by $O_2$ action after the formation of the drain 67.

Figure 5C:
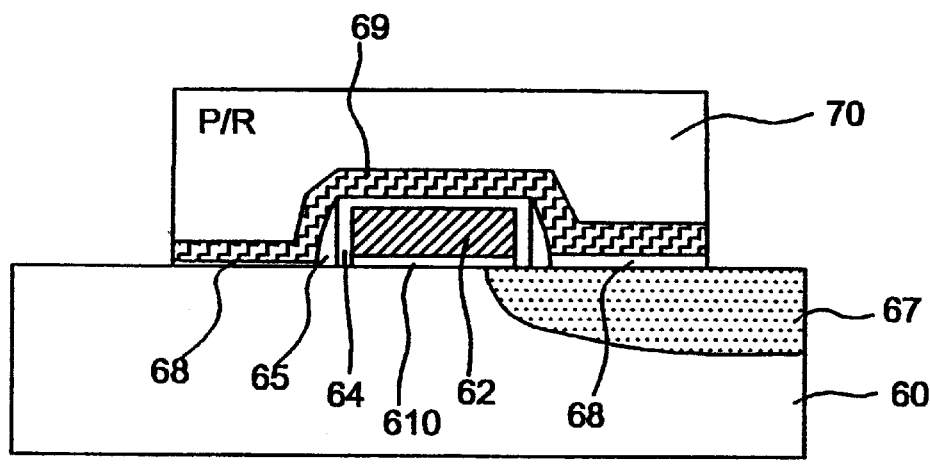

As shown in FIG. 5C, the photoresist pattern is removed and a cleaning process is carried out on the entire surface of the substrate including the above structure, which leaves the source forming region and a surface of the drain 67 exposed. Then, an oxide layer 68 for a tunneling oxide layer 68 is formed on the exposed surface of the device active area of the silicon substrate 60. In this case, the tunneling oxide 68 may be formed by oxidizing the surface of the substrate of silicon thermally, wherein a portion of the oxide layer 68 on the source forming region is formed thinner and preferably formed to be 4 times thinner than the other portion of the oxide layer 68 formed on the drain forming region. Next, another conductive layer 69 is formed on the insulating layer 64, the sidewall spacer 65, and the tunneling oxide layer 68 to form a floating gate 69. In this case, the conductive layer 69 to form a floating gate is preferably formed by depositing in-situ doped polysilicon or by depositing undoped polysilicon and then doping the undoped polysilicon with impurities for electric conduction.

After the conductive layer 69 for a floating gate has been coated with photoresist, a photoresist pattern 70 is formed by exposure and development for use as an exposure mask for forming the floating gate. In this case, the photoresist pattern 70 is formed to remain partially on the conductive layer 69 over the control gate 62, a portion of the drain 67, and a portion of the source forming region. Then, the floating gate 69 and the tunneling oxide layer 68 are formed by sequentially removing the portions of the conductive layer 69 not needed and the portions of the oxide layer not needed, preferably by anisotropic etch such as dry etch or the like. After removal, the floating gate 69, which is the remaining conductive layer, can overlap the control gate 62 and can extend partially into the drain 67 and the source forming regions which in turn can cause the floating gate 69 to remain within the cell area and separated from the neighboring cells.

Figure 5D:
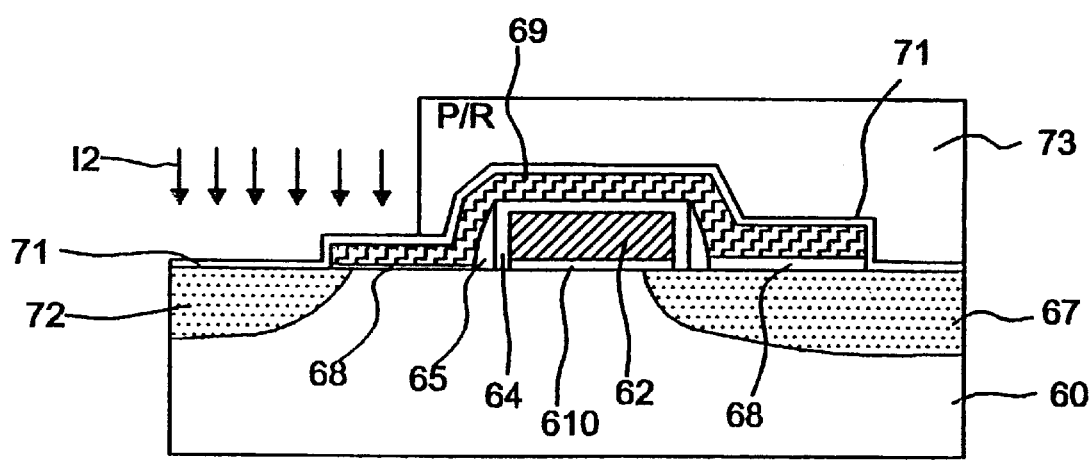

After the photoresist pattern for forming the floating gate has been removed preferably by $O_2$ action or the like to expose a surface of the floating gate 69, as illustrated in FIG. 5D, the surface of the floating gate 69 preferably undergoes a cleaning process to remove particles. An insulating layer 71 can then be formed on the exposed surface of the floating gate 69. In a preferred embodiment, the insulating layer 71 is preferably formed by oxidizing the exposed surface of the floating gate 69 and the exposed surfaces of the drain 67 and the source forming region. Next, a source 72 is preferably formed by doping the exposed source forming region of the substrate with second conductive type impurity ions, where the source 72 is a second conductive type doping region.

The source 72 is preferably formed by forming a photoresist pattern 73 exposing the source forming region after the oxide layer 71 has been coated with photoresist. In this case, a process margin of forming the photoresist pattern 73 exposing the source forming region is sufficient since the drain forming region opposes the source forming region in the device active area centering around the control gate 62 on opposite sides. A second conductive type impurity ion buried layer can be formed by implanting second conductive type impurity ions I2 heavily into the source forming region of the exposed substrate. Then, the source 72 can be formed by diffusing the second conductive type impurity ion buried layer preferably by heat treatment such as annealing or the like. In this case, the photoresist pattern 73 may be removed before the diffusion or by $O_2$ action after the formation of the source 72.

Thus, the control gate 62 can overlap the drain 67 in part and is preferably separated from and does not overlap the source 72. The floating gate 69 preferably overlaps the tunneling oxide layer 68 and preferably overlaps a large portion of the drain 67 and a small portion of the source 72. Thereafter, a surface of the oxide layer 71 can then be exposed again by removing the photoresist pattern 73 for forming the source 72. After an insulating interlayer may be formed on the substrate including the above structure and a contact hole exposing a portion of the drain 67, which is not overlapped with the floating gate 71, may also be formed by removing a portion of the insulating interlayer and the oxide layer 71. Then, a plug may be formed by filling the contact hole and a bit line may be coupled to the plug in or on the insulating interlayer, thereby completing a fabrication of a non-volatile memory cell in a semiconductor device such as EEPROM, flash/EEPROM and the like.

As described above, preferred embodiments of a memory cell EEPROM and methods for forming same have various advantages. Preferred embodiments according to the present invention provide a flash EEPROM able to erase data by block units or in its entirety and also provides a byte erasable EEPROM able to erase data by byte units. The present invention also improves device integration by reducing an area occupied by each of the memory cells. Additionally, the preferred embodiments of the present invention consume a low amount of current since the programming and the erasing can be achieved by F-N tunneling, thereby reducing power consumption.

Also, the preferred embodiments of the present invention are capable of consuming less electricity and therefore can be used with a single power source or low voltage operated products. Further, the preferred embodiments of the present invention are capable of charge pumping. Moreover, the preferred embodiments of the present invention can be programmed at a low level since the threshold voltage for programming is low enough not to form a channel on reading and the threshold voltage for erasing has sufficient negative value, thereby enabling the preferred embodiments of the present invention the capability of use with a single power source and low voltage operated products.

It will be apparent to those skilled in the art that various modifications and variations can be made in a non-volatile semiconductor memory device and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A non-volatile semiconductor memory device, comprising:
   a semiconductor substrate comprising a device active area and a device isolation area;

a control gate on the device active area, wherein the control gate divides the device active area into a first region and a second region;

a control gate insulating layer between the substrate and the control gate;

a first insulating layer covering a top surface and a side of the control gate;

a drain region in the first region of the substrate;

a source region in the second region, wherein the source region is separated from the control gate;

a second insulating layer formed on the second region between the source region and the control gate and formed on a portion of a surface of the first region adjacent the first insulating layer and over the drain region; and a floating gate covering the second insulating layer and the first insulating layer.

2. The device according to claim 1, further comprising a third insulating layer over the floating gate.

3. The device according to claim 2, wherein the first and the third insulating layers comprise high etch selectivity materials.

4. The device according to claim 2, wherein the first and second insulating layers are formed of silicon oxide and the third insulating layer is formed of silicon nitride.

5. The device according to claim 1, wherein the floating gate extends into both the first and second regions and overlaps the control gate.

6. The device according to claim 1, further comprising:

an insulating interlayer covering the device active area including a surface of the floating gate;

a contact hole in the insulating interlayer, wherein the contact hole exposes a portion of the drain region where the floating gate is not located; and a bit line over the insulating interlayer, wherein the bit line is coupled to the drain region through the contact hole.

7. The device according to claim 6, further comprising a fourth insulating layer covering the second region, the floating gate, and the first region where the floating gate is not formed.

8. The device according to claim 1, wherein the source region and drain regions are formed to asymmetrically center around the control gate.

9. A non-volatile semiconductor memory device, comprising:

a plurality of device active areas extending along a first direction separated from one another in parallel on a semiconductor substrate each having a plurality of memory cell areas;

a plurality of control gates crossing over the device active areas, wherein each of the plurality of control gates are separated from one another in a second direction crossing the first direction to determine the memory cell areas;

a plurality of drain regions in the device active areas located on a first side of each of the plurality of control gates;

a plurality of source regions in the device active areas located on a second side of said each of the plurality of control gates opposite from the drain regions; and a plurality of floating gates that overlap the control gates, portions of the drain regions, and portions of the device active areas, wherein the plurality of floating gates do not overlap the source regions formed at the second sides of the control gates.

10. The device according to claim 9, wherein the plurality of device active areas are separated from one another in parallel by a plurality of device isolation layers.

11. The device according to claim 9, wherein each of the plurality of source regions are separated from the control gates.

12. The device according to claim 9, further comprising a plurality of control gate insulating layers between the control gates and the device active areas of the semiconductor substrate.

13. The device according to claim 9, further comprising:

a plurality of bit line contacts at portions of the drain regions that do not overlap the floating gates in the memory cell areas; and a plurality of bit lines, wherein the bit lines are in contact with the bit line contacts, overlap the device active areas and extend in the first direction.

14. The device according to claim 13, wherein the plurality of bit lines are isolated from one another by an insulating interlayer on the device active areas.

15. The device according to claim 9, wherein the floating gates are isolated from the control gates by inter-polysilicon layers.

16. The device according to claim 15, further comprising a plurality of sidewall spacers formed of an insulating material inserted between lateral sides of the inter-polysilicon layers and the floating gates.

17. The device according to claim 16, wherein the insulating material comprises a nitride.

* * * * *